(12) United States Patent
Miller et al.

(10) Patent No.: US 7,267,880 B2
(45) Date of Patent: Sep. 11, 2007

(54) PRESENCE INDICATOR FOR REMOVABLE TRANSPARENT FILM

(75) Inventors: Leah Miller, Avoca, WI (US); Annette Krisko, Prairie due Sac, WI (US); Klaus Hartig, Avoca, WI (US); Roger O'Shaughnessy, Eden Prairie, MN (US); Gary Pfaff, Cazenovia, WI (US)

(73) Assignee: Cardinal CG Company, Eden Prairie, MN (US)

( * ) Notice: Subject to any disclaimer, the term of this patent is extended or adjusted under 35 U.S.C. 154(b) by 360 days.

(21) Appl. No.: 10/866,936

(22) Filed: Jun. 14, 2004

(65) Prior Publication Data

US 2004/0258890 A1 Dec. 23, 2004

Related U.S. Application Data

(60) Provisional application No. 60/479,579, filed on Jun. 17, 2003.

(51) Int. Cl.
*B32B 17/06* (2006.01)
(52) U.S. Cl. .................. 428/432; 428/701; 428/702

(58) Field of Classification Search ...................... None
See application file for complete search history.

(56) References Cited

U.S. PATENT DOCUMENTS

| | | | |
|---|---|---|---|
| 3,612,692 A | 10/1971 | Kruppa et al. | 356/108 |
| 4,538,912 A | 9/1985 | Shaw, Jr. | 356/366 |
| 4,619,504 A | 10/1986 | Daniels et al. | 351/163 |
| 5,731,898 A | 3/1998 | Orzi et al. | 359/587 |

FOREIGN PATENT DOCUMENTS

| WO | WO 01/02496 | 1/2001 |
|---|---|---|
| WO | WO 02/22517 | * 3/2006 |

* cited by examiner

*Primary Examiner*—John J. Zimmerman
*Assistant Examiner*—G. Blackwell
(74) *Attorney, Agent, or Firm*—Fredrikson & Byron, P.A.

(57) ABSTRACT

A substrate having a surface carrying a removable transparent film that can be removed by the surface by a desired washing process, and removable presence indicator associated with the removable transparent film, the presence indicator being removable by the same desired washing process as the removable transparent film. A method of producing a substrate having a presence indicator in contact with a removable transparent film a method of washing a substrate having a presence indicator in contact with a removable transparent film are also disclosed.

55 Claims, 9 Drawing Sheets

55

PRESENCE INDICATOR FOR REMOVABLE TRANSPARENT FILM

RELATED APPLICATIONS

This application claims priority to U.S. Provisional Application No. 60/479,579 filed Jun. 17, 2003, the entire contents of which are incorporated hereby by reference.

FIELD OF THE INVENTION

The present invention relates generally to coatings for glass and other panels. More particularly, this invention relates to panels bearing removable transparent films.

BACKGROUND OF THE INVENTION

A wide variety of transparent films are well known in the art as coatings for panel substrates. Sometimes these films are a permanent component of a film stack and other times they are placed removably on a surface of a substrate (e.g., to protect the substrate surface against contamination). Substrate surfaces are often prone to contamination during manufacturing and installation processes. Removable transparent films used to protect a panel substrate against contamination are exemplified in U.S. patent application Ser. Nos. 10/009,291 and 10/009,284, the entire teachings each of which are herein incorporated by reference. Such removable films are often removed by a washing process. Since transparent films are typically invisible to or (at least not easily seen with) the naked eye, it can be difficult to determine whether a removable film is present on a substrate.

It would be desirable for manufacturers of a panel to be able to determine visually whether a transparent film has been placed on the panel substrate. Occasionally, manufacturers may inadvertently omit the removable transparent film during manufacturing. Sometimes, manufacturers are unable to tell if the removable transparent film has been yet applied.

It would also be desirable for the consumer or the person washing the substrate surface (e.g., when it is desired to remove the removable transparent film) to be able to tell whether the removable transparent film has been completely removed from the substrate surface during washing. A substrate surface may serve a functional purpose, for example it may be hydrophilic or photocatalytic. In these cases, the functional characteristics of such functional coatings may not be fully exhibited until the removable transparent film is completely removed.

SUMMARY OF THE INVENTION

The present invention relates to a panel, such as a glass pane, that comprises a substrate having a surface carrying a removable transparent film that can be removed from the surface by a desired washing process. A removable presence indicator is associated with, and desirably is provided in contact with, the removable transparent film. The presence indicator desirably is visible to the naked eye and signals the presence of the removable transparent film. The presence indicator desirably is removable by the same washing process as the removable transparent film.

The presence indicator includes a detectable and preferably a visibly detectable characteristic such as color, opacity, ink, metal, and non-reflectance. The presence indicator can be provided in any suitable form. For example, in some embodiments the presence indicator comprises a continuous thin film and in other embodiments the presence indicator comprises a plurality of visible material deposits. In certain embodiments, the plurality of visible material deposits comprises water-soluble ink and in other embodiments the plurality of visible material deposits comprises one or more decals. The decals can be made porous and/or can contain machine readable information. In cases where it is desired to temper the glass, the decals can be made of organic material.

The presence indicator can be associated with the removable transparent film in any manner that enables removal or disappearance of the presence indicator when the removable transparent film is removed. In some embodiments, the presence indicator is provided in contact with the inner surface of the transparent film, that is, at the interface of the substrate and the transparent film. In other embodiments, the presence indicator is provided in contact with the outer surface of the transparent film, that is, the surface of the transparent film furthest from the substrate. The presence indicator may also comprise a first presence indicator portion provided in contact with the inner surface of the transparent film and a second presence indicator portion provided in contact with the outer surface of the transparent film. In further embodiments, the presence indicator is incorporated in the transparent film. For example, the presence indicator may comprise colorants or visible metal components incorporated in the transparent film.

In certain embodiments, the present invention also provides a panel comprising a substrate having a surface carrying a removable transparent film that is stable in the presence of water but that can be removed from said surface by washing with a mild acid or a mild base. The panel includes a removable presence indicator associated with the removable transparent film wherein the presence indicator comprises a water-soluble ink applied over the removable transparent film.

The present invention also includes a method of producing a panel with a substrate having a presence indicator associated with a removable transparent film. In certain embodiments, the method comprises providing a panel substrate having a surface carrying a removable transparent film that can be removed from the surface by a desired washing process. The method includes applying at least one removable presence indicator in contact with the removable transparent film. The presence indicator can be placed in contact with the outer surface, the inner surface, or both surfaces of the removable transparent film. In some embodiments, the presence indicator is incorporated in the removable transparent film. The presence indicator is preferably removable by the same desired washing process as the removable transparent film.

The present invention also includes a method for cleaning a panel substrate to assure exposure of a substrate surface, particularly a functional surface. In certain embodiments, the method comprises providing a substrate having a surface bearing a removable transparent film in contact with a presence indicator signaling the presence of the removable film, and washing the substrate sufficiently to remove the removable transparent film until the presence indicator is no longer visible to thereby expose the surface. The presence indicator will typically have a detectable characteristic and the substrate will be washed until the detectable characteristic is no longer detected.

DETAILED DESCRIPTION OF THE PREFERRED EMBODIMENTS

Figure 1:
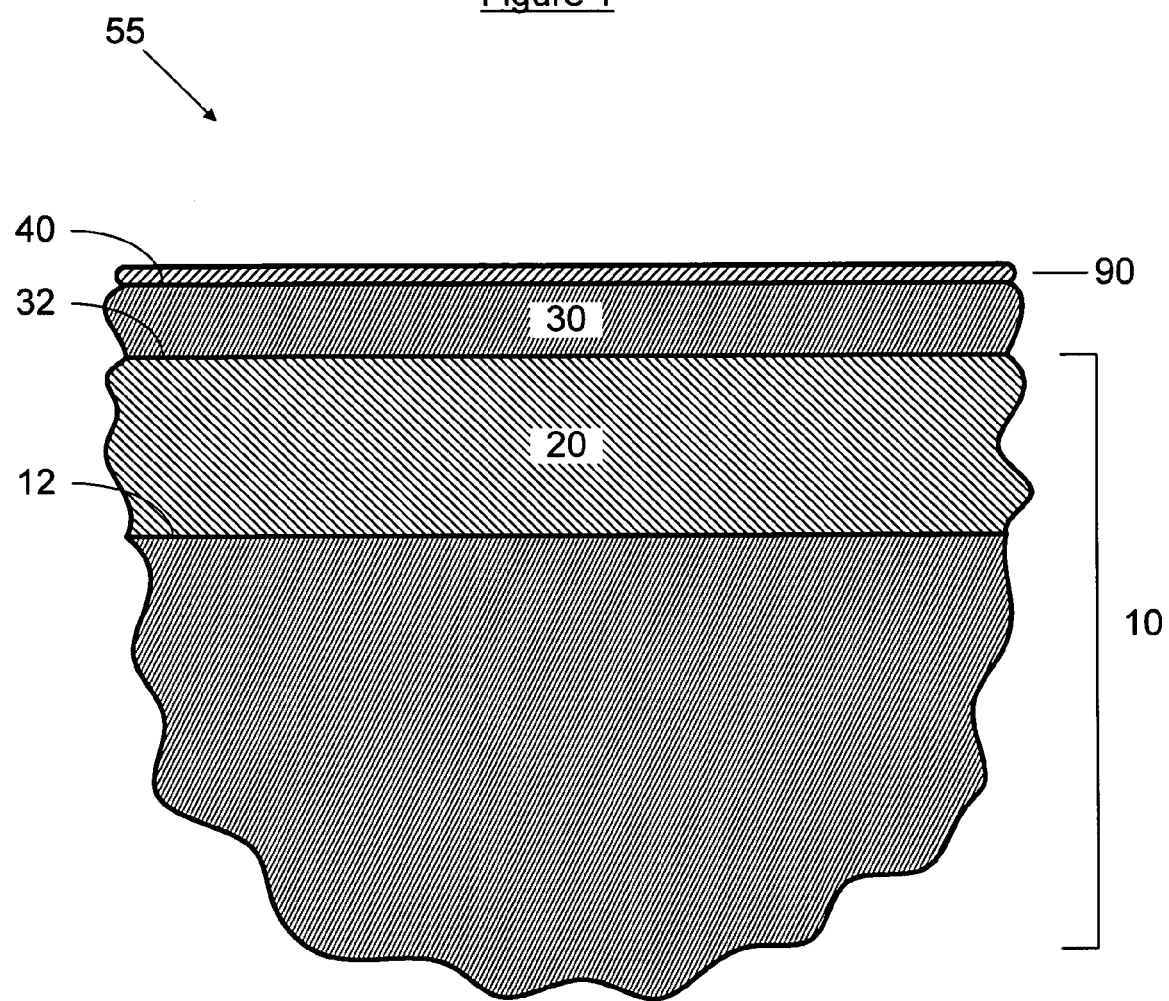
FIGS. 1-8 are schematic cross-sectional views of a panel having a substrate having a surface carrying a presence indicator in contact with a removable transparent film in accordance with different embodiments of the invention.

The following detailed description is to be read with reference to the drawing, in which like elements in different figures have been given like reference numerals. The drawing figures, which are not necessarily to scale, depict selected embodiments and are not intended to limit the scope of the invention. Examples of constructions, materials, dimensions, and manufacturing processes are provided for selected elements. All other elements employ that which is known to those of skill in the art of the invention. Skilled artisans will recognize that the examples provided herein have many suitable alternatives that can be utilized, and which fall within the scope of the invention.

Referring to the drawing, a panel 55 comprises a substrate 10 such as a glass pane, the substrate having a surface 12 carrying, as part of the substrate, a coating 20 and a removable protective transparent film 30 that can be removed from the surface by a desired washing process. "Substrate", as used herein, refers to the panel material (e.g., glass) together with the coating 20 forming a surface 12 of the substrate. A removable presence indicator 90 is associated with the removable transparent film 30 and is preferably removable by the same desired washing process as the removable transparent film 30.

A variety of panel substrates are suitable for use as substrate 10 in the present invention. In certain embodiments, the panel 55 comprises a glass or other transparent substrate. However the substrate material is not required to be transparent. For example, substrates having an opaque material may be useful in some cases. However, it is anticipated that for most applications, the substrate will comprise a transparent or translucent material, such as glass or clear plastic. In many cases, the substrate will be a glass pane. A variety of known glass types can be used, and soda lime glass is expected to be preferred.

The panel 55 can also be adapted to be incorporated into a multiple-pane insulating glass unit (i.e., an "IG" unit). IG units are well known in the art and need not be discussed in detail. Briefly, an IG unit generally comprises two or more panes (e.g., of glass) held in a spaced-apart relationship by a spacer. Particularly useful IG units are described in U.S. patent application Ser. No. 10/076,211, the entire teachings of which are herein incorporated by reference.

The surface 12 of a substrate, in preferred embodiments, is formed by a coating 20. The coating 20 can be any desired single-layer coating or multiple-layer film stack. Certain useful coatings are further described below. However, any desired coating can be used and those skilled in the art would have no problem selecting different coatings for use as coating 20.

In certain embodiments, the coating 20 includes a hydrophilic coating. Useful hydrophilic coatings are disclosed in U.S. patent application Ser. Nos. 09/868,542, 09/572,766, 09/576,766 and 09/599,301, the entire contents of each of which are incorporated herein by reference. The term "hydrophilic" is used herein to refer to any coating or surface that tends to cause water applied thereto to form a sheet, rather than to bead up. In a preferred embodiment, the hydrophilic coating is a water-sheeting coating comprised of silicon dioxide. The water-sheeting coating is preferably of the type described in detail in U.S. patent application Ser. Nos. 09/868,542 and 09/599,301. However, while a preferred hydrophilic coating can be quite advantageously formed of silicon dioxide, this is by no means a requirement. Rather, any desired hydrophilic coating can be used.

In certain embodiments, the coating 20 of the substrate includes a photocatalytic coating. The field of photocatalytic coating technology is founded on the ability of certain metal oxides to absorb ultraviolet radiation and photocatalytically degrade organic materials. The most powerful of these photocatalytic metal oxides appears to be titania. However, other materials are believed to exhibit photoactivity as well, including oxides of iron, silver, copper, tungsten, aluminum, zinc, strontium, palladium, gold, platinum, nickel, and cobalt. Useful photocatalytic coatings are described in U.S. Pat. No. 5,874,701 (Watanabe et al), U.S. Pat. No. 5,853,866 (Watanabe et al), U.S. Pat. No. 5,961,843 (Hayakawa et al.), U.S. Pat. No. 6,139,803 (Watanabe et al), U.S. Pat. No. 6,191,062 (Hayakawa et al.), U.S. Pat. No. 5,939,194 (Hashimoto et al U.S. Pat. No. 6,013,372 (Hayakawa et al.), U.S. Pat. No. 6,090,489 (Hayakawa et al.), U.S. Pat. No. 6,210,779 (Watanabe et al U.S. Pat. No. 6,165,256 (Hayakawa et al.), and U.S. Pat. No. 5,616,532 (Heller et al.), the entire contents of each of which are incorporated herein by reference. A discussion of all known photocatalytic coatings is beyond the scope of the present disclosure, as the coating 20 can include essentially any photocatalytic coating, including photocatalytic coatings (or self-cleaning coatings based on a mechanism other than photocatalytic) not yet discovered.

In other embodiments, the coating 20 includes a reflective coating, which may contain a variety of films stacked upon one another. As those skilled in the art will appreciate, a wide variety of reflective coatings are known and the reflective coating can take any desired form depending on the intended properties. In preferred embodiments, the reflective coating comprises a low-emissivity coating. Low-emissivity coatings are well known in the present art. Typically, they include one or more infrared-reflective films each positioned between two or more transparent dielectric films. The infrared-reflective films, which are typically conductive metals such as silver, gold, or copper, reduce the transmission of radiant heat through the coating (e.g., by reflecting infrared radiation). The transparent dielectric films are used primarily to reduce visible reflectance and to control other coating properties, such as color. Commonly used transparent dielectrics include oxides of zinc, tin, and titanium, as well as nitrides such as silicon nitride. Typically, the removable transparent film will be carried on an exterior surface of the panel (such that when the panel is mounted in its intended position, the surface 12 and the optional coating 20 are oriented toward a outdoor environment). Thus, in embodiments wherein the removable transparent film is deposited over a low-emissivity coating, the low-emissivity coating will commonly be a pyrolytically applied coating. Coatings of this nature are described in U.S. patent application (Soubeyrand et al.), the entire teachings of which are herein incorporated by reference.

Further, any suitable method can be used to provide the substrate with the desired coating 20. Suitable methods include sputtering, evaporation, and CVD deposition. In preferred embodiments, the coating 20 is applied to the substrate surface 12 using a magnetron sputtering technique. Sputtering techniques and equipment are well known in the art. For example, magnetron sputtering chambers and related equipment are commercially available from a variety of sources (e.g., Leybold and BOC Coating Technology). Useful magnetron sputtering techniques and equipment are also disclosed in U.S. Pat. No. 4,166,018 (Chapin), the entire teachings of which are incorporated herein by reference.

The outer surface of the substrate 10 (that is, the outer surface 32 of the coating 20) carries a removable transparent film 30. The removable transparent film 30 can be applied directly to the surface 32, as exemplified in FIG. 1, or it may be supported on (e.g., deposited over) a layer 90 containing a presence indicator, as exemplified in FIG. 2. Further, any suitable method can be used to apply the removable transparent film 30 over the substrate surface 32. Suitable methods include sputtering, evaporation and CVD deposition. In preferred embodiments, the removable transparent film 30 is applied to the substrate surface 32 using a magnetron sputtering technique (such that the film 30 is a sputtered film).

The removable transparent film 30 is generally any film whose presence or absence is not readily detectable with the naked eye. In preferred embodiments, the removable transparent film 30 is a transparent film used to protect the substrate surface 32 or coating 20 from becoming contaminated. Particularly useful protective transparent films are described in U.S. patent application Ser. Nos. 10/009,291 and 10/009,284, which have been incorporated by reference. Such a transparent film is particularly useful for protecting substrate surfaces including hydrophilic or photocatalytic coatings. There is virtually no limit on the types of coatings that would benefit from such temporary protection.

In certain embodiments, it is desirable that the removable transparent film 30 be durable to tempering or another desired heat treatment, since it is often necessary to heat glass sheets to temperatures at or near the melting point of glass to temper the sheets or to enable them to be bent into desired shapes, such as motor vehicle windshields. Tempering is particularly important for glass destined for use as automobile windows and particularly for use as automobile windshields. Upon breaking, tempered glass desirably exhibits a break pattern in which it shatters into a great many small pieces, rather than large dangerous shards. Coated glass sheets often must be able to withstand elevated tempering temperatures (e.g., on the order of 600 degrees C. and above) for significant periods of time (e.g., hours). Thus, in a preferred embodiment, the removable transparent film 30 is durable (e.g., does not burn off) to elevated temperatures on the order of at least about 600 degrees Celsius.

Preferably, the removable transparent film 30 comprises a film that is quite thin (e.g., on the order of 2500 Å or less). More preferably, the removable transparent film 30 has a thickness of less than about 100 Å. Since the transparent film 30 desirably is removable by washing thicknesses in this range are preferable as they facilitate complete, uniform removal of the film upon washing. Even with transparent films having a protective purpose, films having a thickness as small as about 5-10 Å may be suitable to serve this purpose. The transparent film 30 is most beneficial in terms of protection against contamination coupled with uniform removability when the thickness is at a range of between about 25 Å and about 60 Å and optimally between about 25 Å and about 45 Å. However, if the transparent film 30 is to be subjected to tempering or another desired heat treatment, the film preferably has a thickness of at least 20 Å and more preferably at least 25 Å. This is because films having a thickness of less than about 20 Å can be negatively impacted by tempering procedures. Transparent films having a thickness of more than 100 Å may be beneficial for certain applications. However, it has been discovered that such films are not as easily removed by washing. Thus, certain embodiments involve a film 30 having a thickness of between about 10 Å and about 100 Å.

In certain embodiments, the removable transparent film 30 comprises an inorganic material. This is especially desirable when the removable transparent film 30 is used to protect the properties of a photocatalytic coating, and also when the film 30 must withstand glass tempering (or other elevated temperature) conditions. Photocatalytic coatings tend to degrade organic contaminants, but they typically do not break down inorganic materials. Thus, if a transparent film consisting of organic material were carried directly upon a photocatalytic coating, then the transparent film may deteriorate as a result of the decomposition ability of the photocatalytic coating. When the removable transparent film 30 is carried directly upon a photocatalytic coating, the film 30 preferably comprises an inorganic material that is durable to the photoactivity of such coating.

In certain embodiments, the removable transparent film 30 comprises an oxide of a metal. The term "metal" is used herein to refer to metals such as zinc and metalloids or semi-metals such as silicon. In a particularly preferred embodiment, the removable transparent film 30 comprises one or more of a number of preferred metal oxides. These preferred metal oxides include oxides of metals selected from the group consisting of zinc, bismuth, cadmium, iron, and nickel. The oxides of this group are stable in water, but tend to break down in the presence of weak acids or weak bases. Thus, they are readily removed when washed with washing fluids that are mildly acidic or mildly basic, but are stable to washing fluids at about pH7.

In preferred embodiments, the removable transparent film 30 comprises zinc oxide, desirably sputtered zinc oxide. It has been discovered that zinc oxide is remarkably well suited for use as a removable transparent film. For example, it has been found that zinc oxide at a thickness of less than about 100 Å is effective in protecting an underlying surface against surface contamination. Zinc oxide films also tend to be durable to tempering procedures at thicknesses of at least about 25 Å. Thus, the thickness of a zinc oxide removable film preferably is at least about 25 Å, more preferably between about 25 Å and about 60 Å, and perhaps optimally between about 25 Å and about 45 Å. Further, it has been discovered that zinc oxide is particularly easy to remove in a complete and uniform manner when washed with acidic or basic aqueous solutions, e.g., a weak acid such as vinegar or a weak base such as dilute ammonium hydroxide. Zinc oxide can also be sputtered at a very high rate and is consequently deposited at relatively low cost. In certain embodiments, the film 30 consists essentially of zinc oxide.

Preferably, the transparent removable film 30 is stable in the presence of water having a neutral pH, but breaks down, dissolves, softens, or otherwise deteriorates in the presence of a washing fluid that is mildly acidic or mildly basic. Preferably, the film is formed of material that breaks down in the presence of a weak organic acid, such as the acetic acid of common household vinegar. While the acidity of different vinegars may vary, the pH of common household vinegar is estimated to be about 3. Alternatively, the film is formed of material that breaks down in the presence of a weak base, such as a weak ammonia solution. Common household ammonia solution is estimated to have a pH of between about 11 and about 12.5.

The removable transparent film 30 can be removed by any desired washing process. The washing can be performed using any conventional washing technique. For example, the film can be washed with a cloth that has been moistened or soaked with a desired washing fluid. The washing step can be performed whenever it is desired to expose the underlying substrate surface 12, i.e., the coating surface 32. Preferably, the substrate surface 32 has sufficient mechanical durability to withstand the rigors of common window washing techniques without becoming unacceptably scratched or otherwise damaged (e.g., there is no silver containing film between the substrate and the removable transparent film, as silver tends to be less durable than is desired). Also preferably, the substrate surface 32 has sufficient chemical durability to be resistant to (i.e., be stable in the presence of) a washing fluid that is mildly acidic or mildly basic. More preferably, the substrate surface 32 is entirely unaffected by contact with mild acids and mild bases.

In some cases, when the transparent film 30 is removed, the substrate surface 32 is exposed to a certain environment, e.g., an outdoor environment. In these cases, the substrate surface 32 is preferably durable to (e.g., adapted to withstand) prolonged exposure to outdoor weather conditions, such as periodic contact with rain (i.e., water which may be slightly acidic or basic).

The presence indicator 90 generally includes any detectable material or visible characteristic in association (e.g. contact) with the removable transparent film 30 and that can be readily detected by visual inspection with the naked eye. In certain embodiments, the detectable characteristic comprises color, as when dyes or naturally colored metal oxides are used. In other embodiments, the detectable characteristic comprises opacity, as when opaque inks are used. In another embodiment, the detectable characteristic comprises a visible metal component such as a substoichiometric or superstoichiometric compound. Preferably, the visible metal component comprises a substoichiometric or superstoichiometric metal oxide. Optimally, the visible metal component comprises a substoichiometric or superstoichiometric zinc oxide. In yet another embodiment, the underlying substrate surface 32 is reflective and the detectable characteristic comprises non-reflectance (or readily visibly apparent low reflectance).

Figure 2:
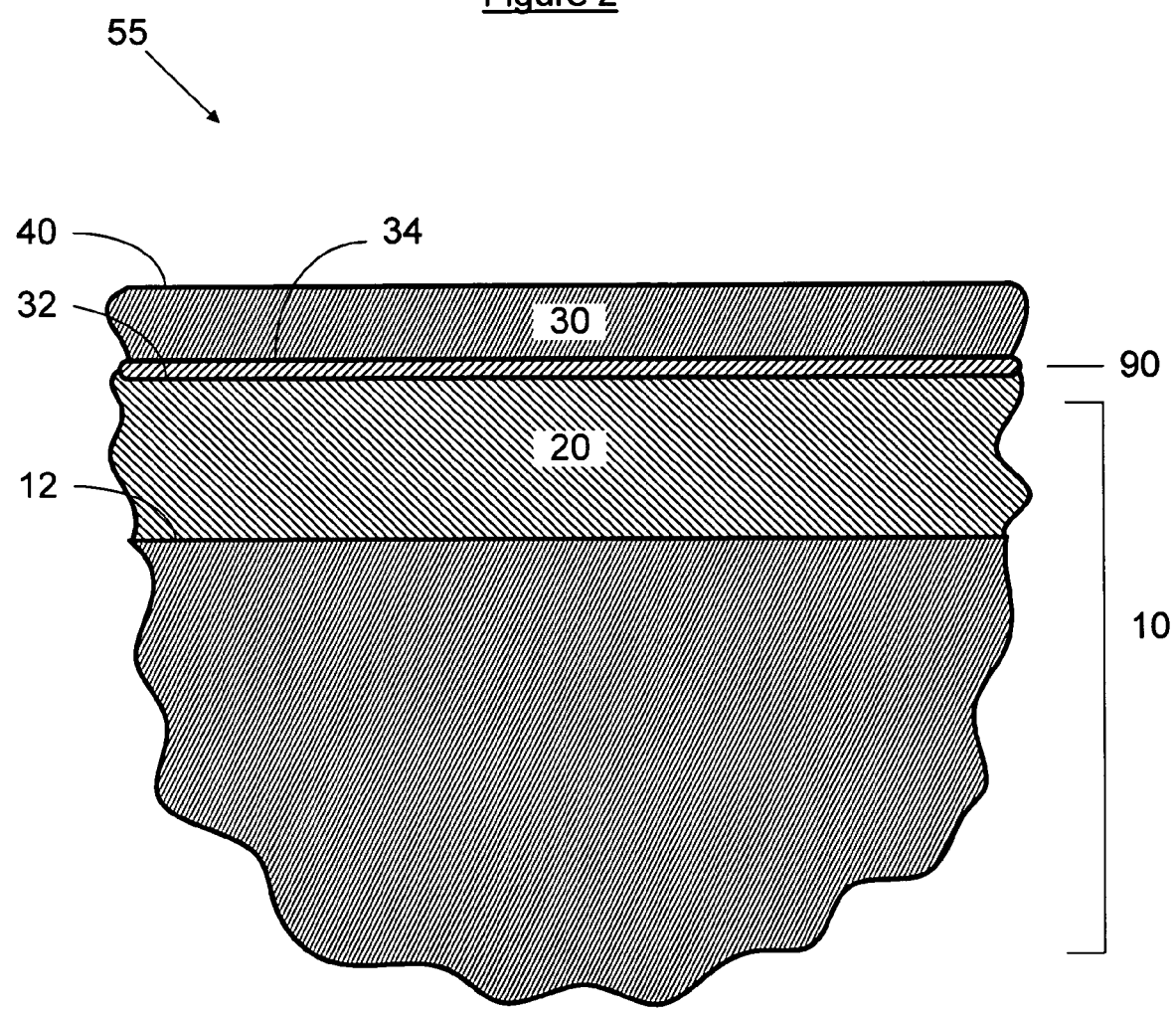
Figure 3:
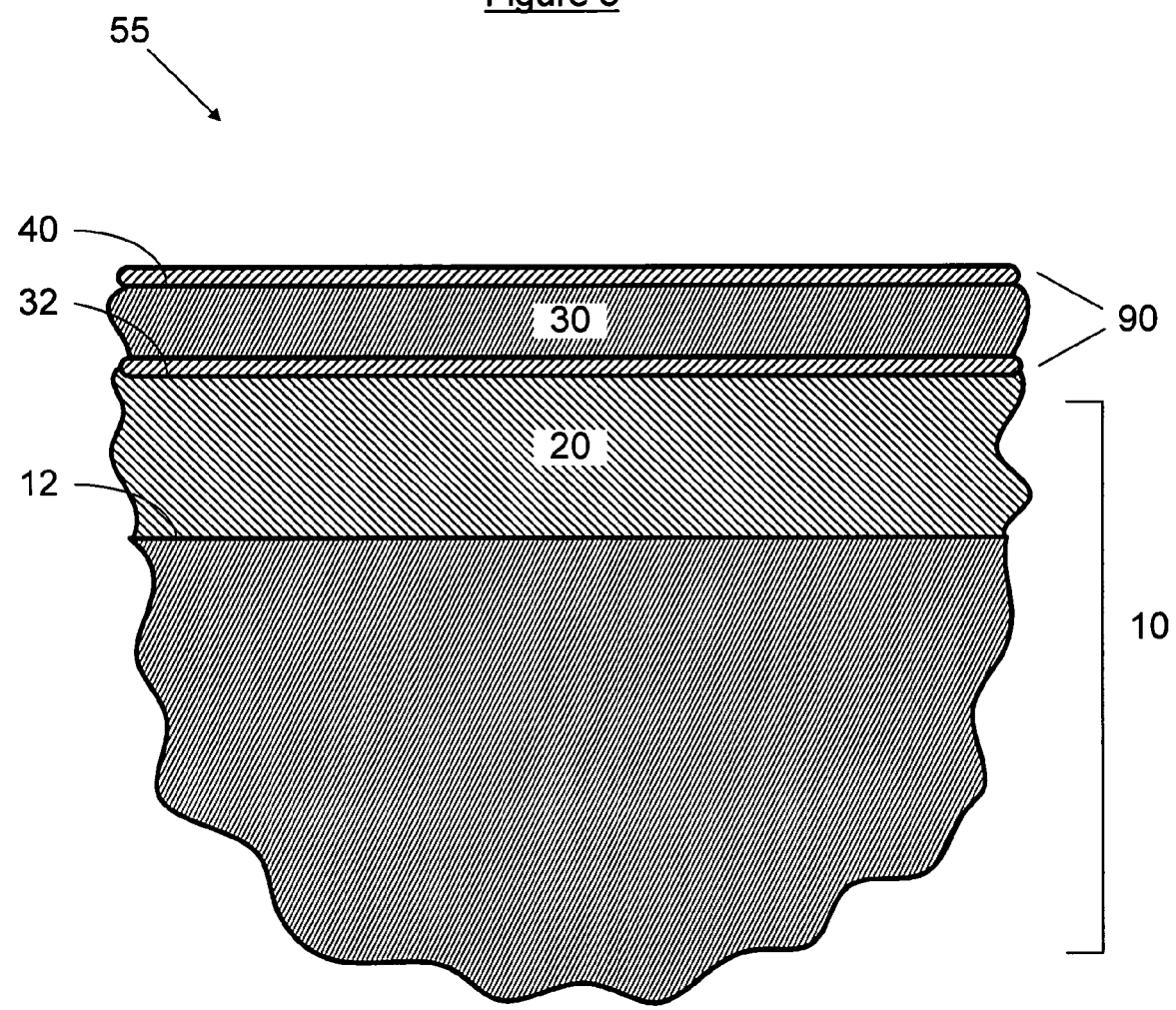
Figure 4:
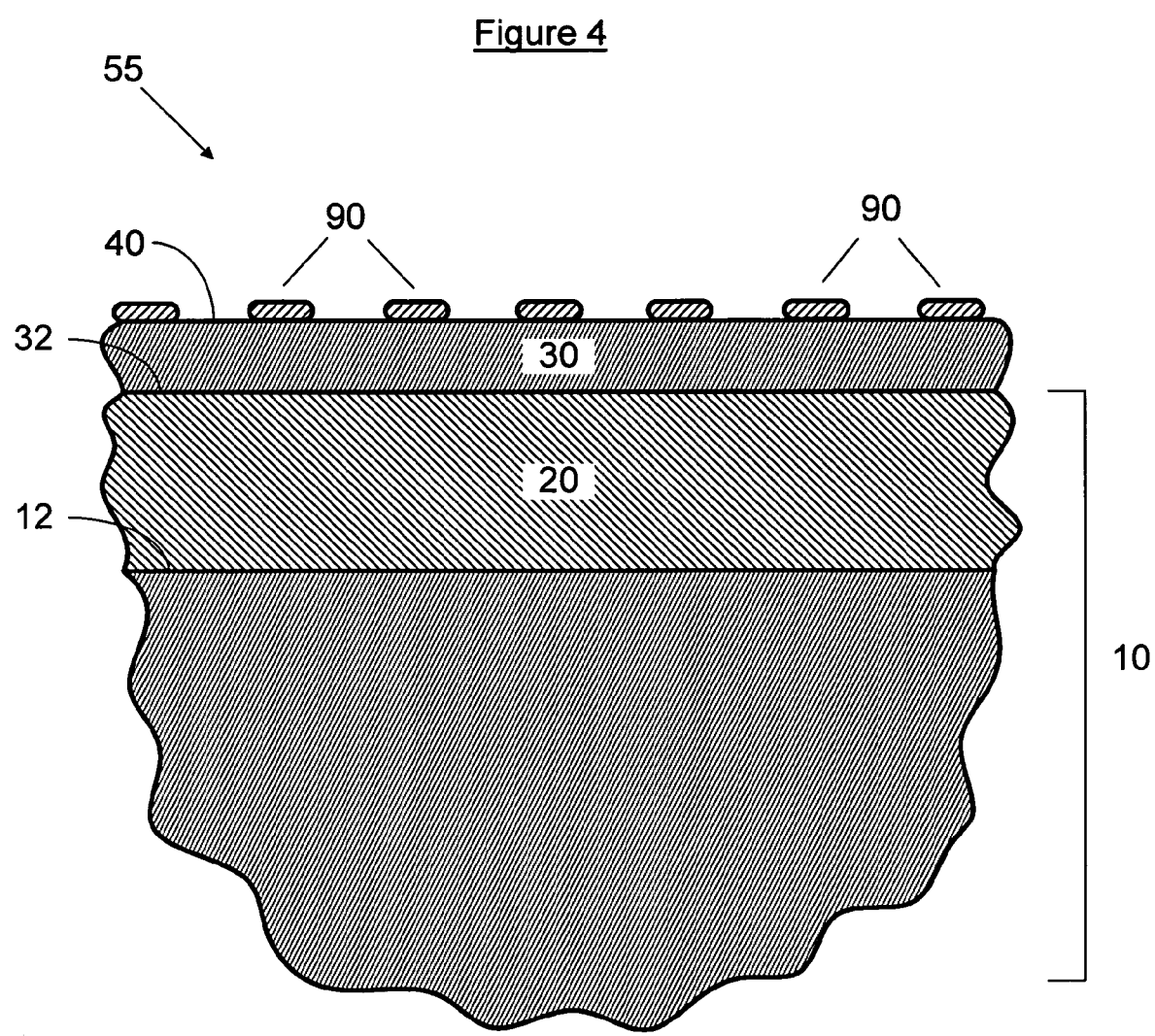
Figure 5:
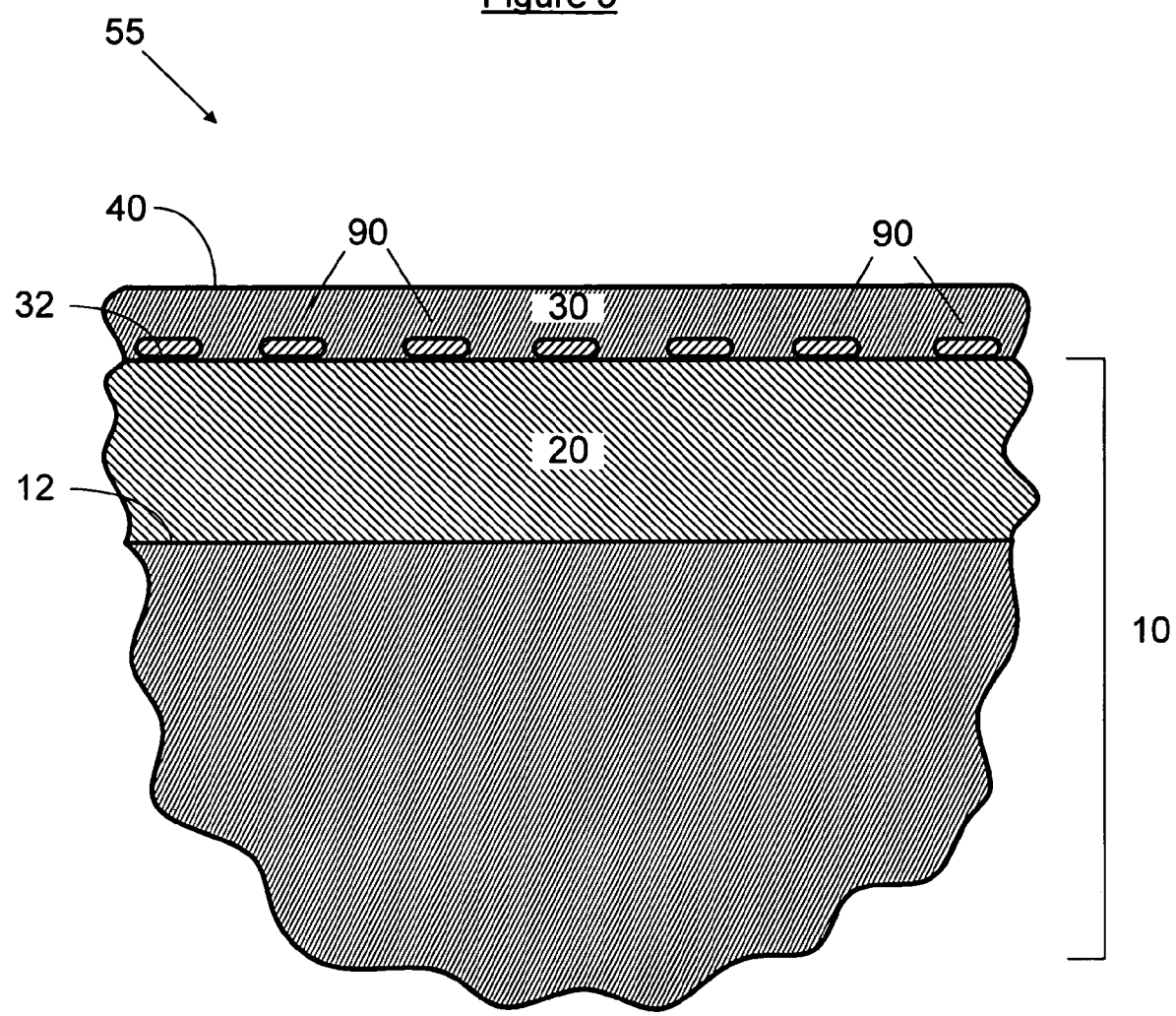
Figure 6:
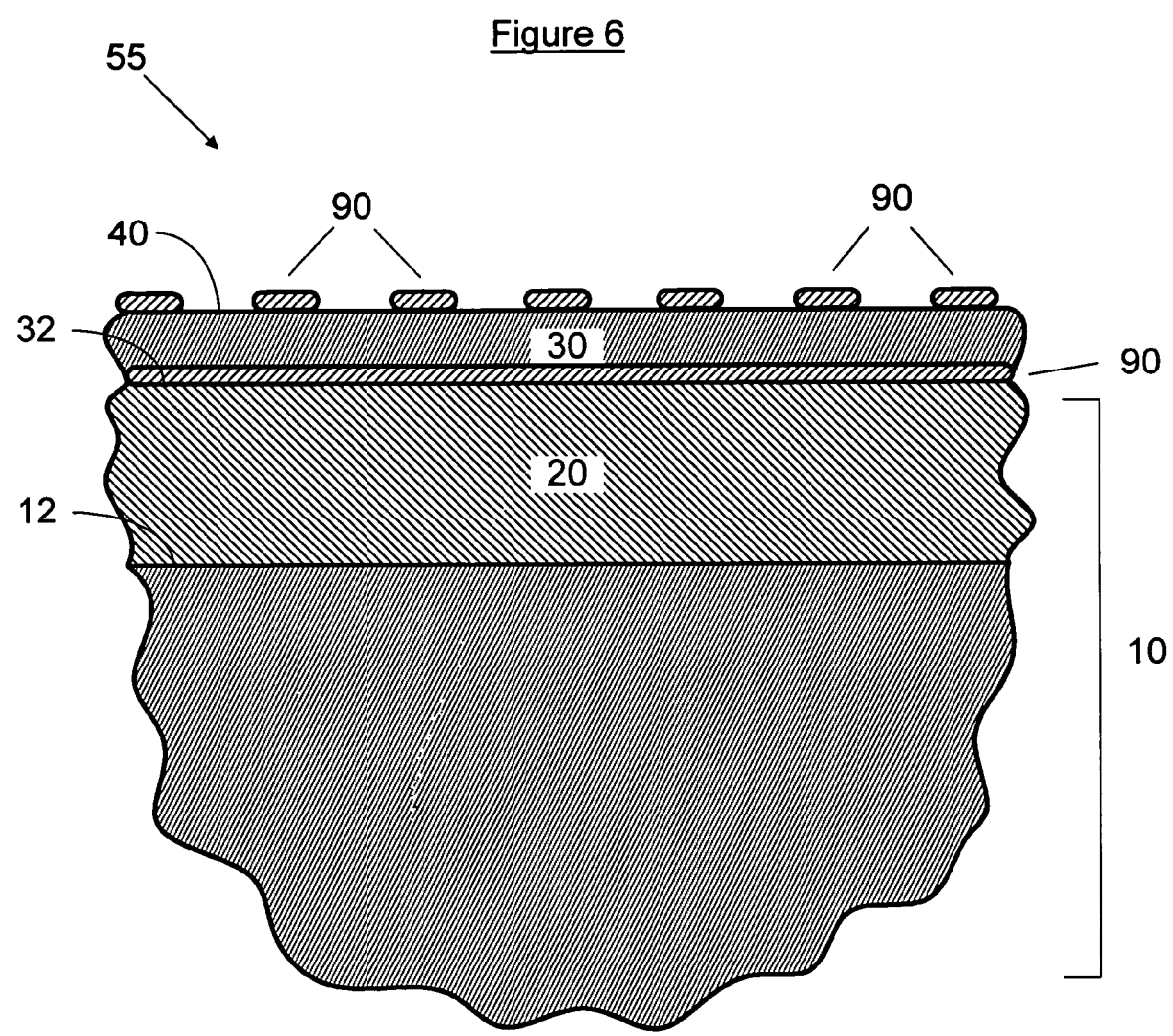
Figure 7:
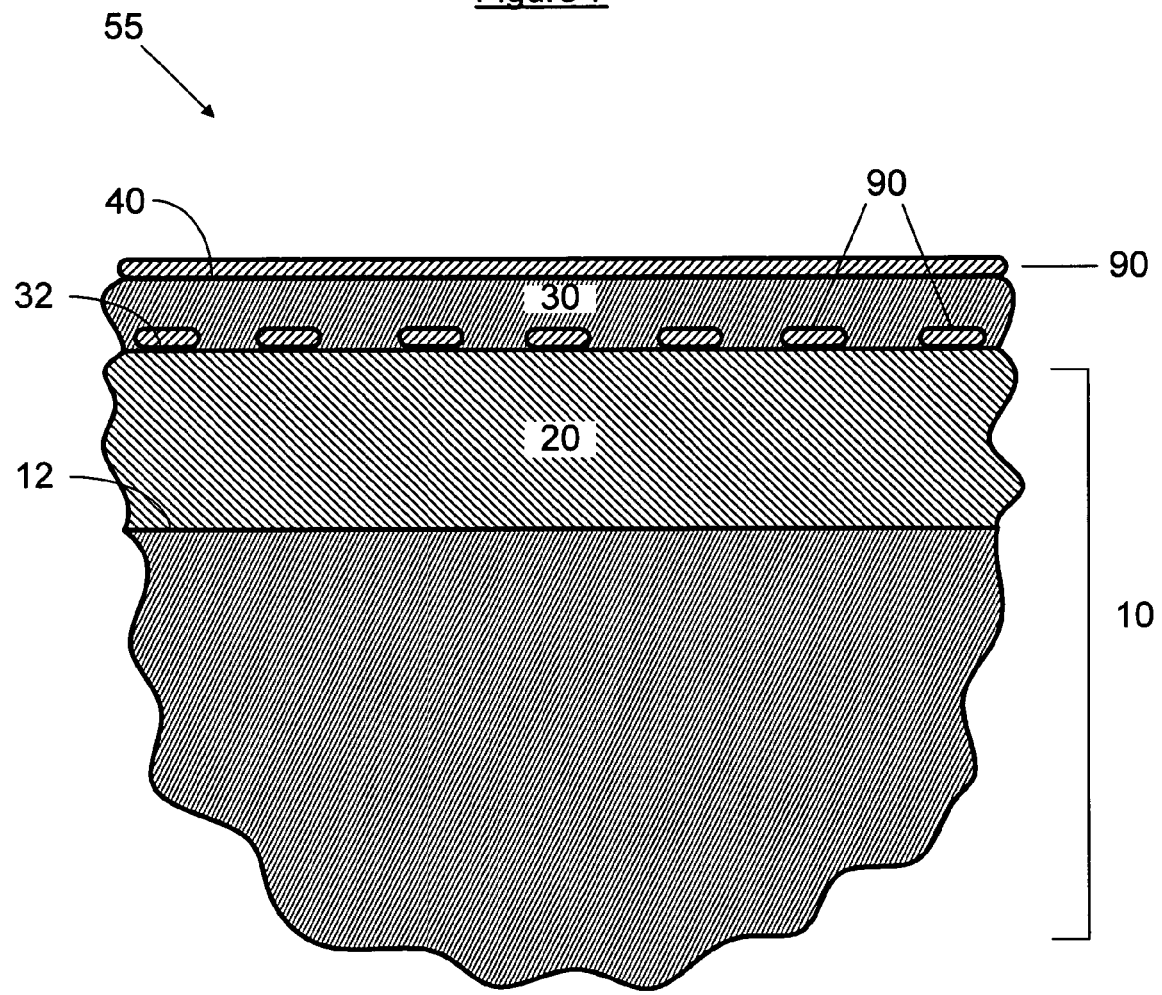
Figure 8:
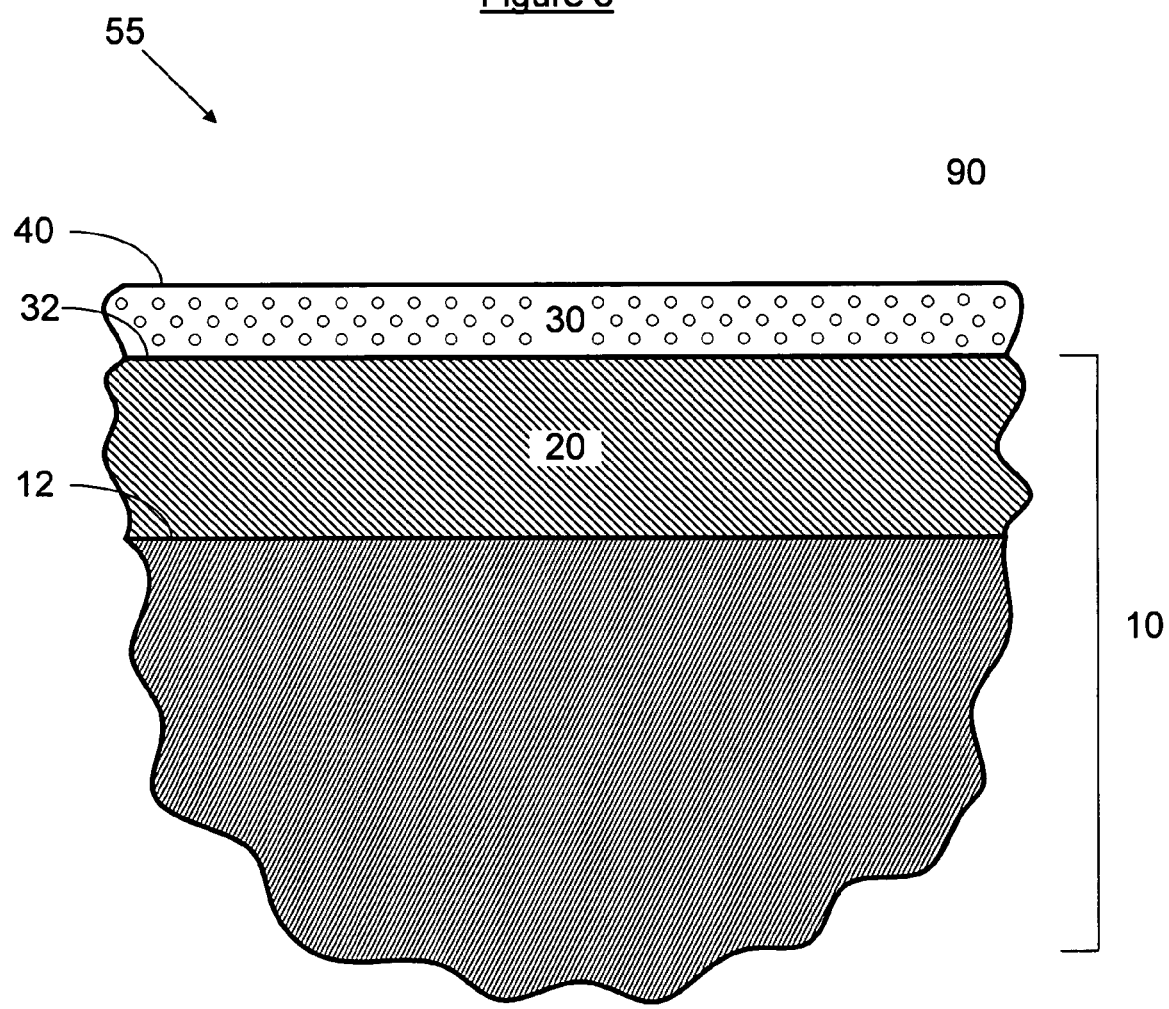

The presence indicator 90 can be associated with the removable transparent film 30 in any manner such that removal of the film 30 removes or alters the detectable characteristic to provide a visible signal that the film 30 has been removed. In some embodiments, as depicted in FIGS. 1 and 4, the presence indicator 90 is provided in contact with (e.g., is deposited directly over) the outer surface 40 of the removable transparent film 30. The outer surface 40 typically comprises the surface of the transparent film 30 furthest from the substrate 10. In other embodiments, as depicted in FIGS. 2 and 5, the presence indicator 90 is provided in contact with the inner surface 34 of the removable transparent film 30, that is, the surface nearer the coating 20. In further embodiments, as depicted in FIGS. 3, 6, and 7, a first presence indicator is provided in contact with the outer surface 40 of the removable transparent film 30 and a second presence indicator is provided in contact with the inner surface 34 of the removable transparent film 30. In certain embodiments, as depicted in FIG. 8, the presence indicator 90 is incorporated in the removable transparent film 30.

In certain embodiments, the presence indicator 90 has a function of alerting the manufacturer of the presence of the removable transparent film 30. For example, in FIGS. 1 and 3, the presence indicator 90 comprises a single presence indicator provided on top of the removable transparent film 30 so as to alert the manufacturer that the film 30 has been applied and is still in place over the film 30. In FIG. 8, the presence indicator 90 is incorporated within the removable transparent film 30 and its presence will signal that the transparent film 30 has indeed been applied and is still in place. However, these embodiments may not be as beneficial in alerting the washer of the film stack of when the removable transparent film has been completely removed. For example, if the presence indicator 90 is a colorant included in the removable transparent film 30, it will be understood that unless the colorant is quite concentrated, the amount of color detectable by the naked eye as washing proceeds will slowly diminish and as the film becomes thinner, it may be difficult to tell when all of the film 30 has been removed. Also, if the presence indicator 90 is located on top of the removable transparent film 30, the presence indicator will be removed during washing before the remaining removable transparent film 30. Since the remaining removable film 30 is transparent, the washer may not be alerted when the film 30 has been completely removed.

Therefore, it would be desirable in some embodiments to arrange the removable transparent film 30 and presence indicator 90 in such a manner that one who washes the substrate to expose the underlying surface will be able to easily tell when the layer 30 has been removed. Preferably, the transparent film 30 and presence indicator 90 will be arranged such that an abrupt (e.g., readily perceptible) visible change occurs when the last of the transparent film 30 has been removed. One method of accomplishing this is to place the presence indicator 90 beneath the transparent film 30, that is, between the coating 20 and the transparent film 30. FIGS. 2, 3, 5, 6, and 7 depict at least one presence indicator 90 between the coating 20 and the transparent film 30. In FIGS. 2, 3, and 6 the presence indicator 90 is in the form of a thin film positioned between the coating 20 and transparent film 30. In FIGS. 5 and 6, the presence indicator 90 is in the form of a plurality of visible material deposits positioned between the coating 20 and transparent film 30.

The embodiments shown in FIGS. 3, 6, and 7 are advantageous in that two presence indicators 90 are provided in association with the removable transparent film 30. The benefit of having two presence indicators is that the first presence indicator 90 positioned between the coating 20 and transparent film 30 can be of one type to alert the washer of when the transparent film 30 has been completely removed whereas the second presence indicator 90 positioned on top of the transparent film can be of another type to alert the manufacturer of whether the transparent film 30 has yet been applied to the film stack. In these embodiments, both functions of the presence indicators are accomplished.

The presence indicator 90 can be provided in various forms. In certain embodiments, as best depicted in FIGS. 1-3, the presence indicator 90 comprises a continuous thin film that is visible to the naked eye. The continuous thin film can be any film that has a detectable characteristic making it visible to the naked eye. For example, in some embodiments, the continuous thin film can be a colored thin film. In other embodiments, the thin film can be an opaque thin film. Opaque thin films are particularly useful when the underlying surface is transparent. In other embodiments, the thin film can be a non-reflective thin film (or a thin film this is less visibly reflective than the underlying layer or layers). Non-reflective thin films are particularly useful when the underlying surface is reflective.

In other embodiments, the thin film can be a thin film of a substoichiometric or superstoichiometric compound. Preferably, the thin film is a substoichiometric or superstoichiometric metal oxide. Optimally, the thin film is a substoichiometric or superstoichiometric zinc oxide. A thin film made of substoichiometric or superstoichiometric zinc oxide is particularly preferred, as it is durable to tempering and other heat treatment procedures.

The thin film 90 can be provided anywhere in contact with the removable transparent film 30. In the embodiment depicted in FIG. 1, the thin film is provided on the outer surface 32 of the removable transparent film 30. In the embodiment depicted in FIG. 2, a thin film is provided on the inner surface 34 of the removable transparent film 30. In the embodiment depicted in FIG. 3, a first thin film is provided on the outer surface 32 of the removable transparent film 30 and a second thin film is provided on the inner surface 34 of the removable transparent film.

In some embodiments, as best depicted in FIGS. 4 and 5, the presence indicator 90 comprises a plurality of visible material deposits. Unlike the continuous thin film of FIGS. 1 and 2, the material deposits are not provided in a continuous manner. The visible material deposits can include any type of material that is deposited in a non-continuous manner (e.g., as spaced apart deposits). For example, the deposits can be provided in the form of patterns, words, or logos, all of which are deposits of material that are not continuous in nature.

In the embodiments depicted in FIG. 4, visible material deposits are provided on the outer surface 40 of the removable transparent film 30, whereas in FIG. 5, the visible material deposits are provided in or on the inner surface 34 of the removable transparent film 30. Any suitable method can be used to deposit the plurality of visible material deposits in contact with the removable transparent film 30. In some embodiments, the deposits are deposited by spraying or sputtering. A sol-gel method may also be used to deposit the material. In other embodiments, a mask or similar feature is used to provide a patterned deposition.

In certain embodiments, the plurality of visible material deposits includes one or more colorants or may include deposits of a visible metal oxide. In some embodiments, the visible metal oxide includes one or more colorants. In other embodiments, the plurality of visible material deposits include deposits of visibly detectable substoichiometric or superstoichiometric compounds, preferably, substoichiometric or superstoichiometric metal oxide. Optimally, the deposits of visible metal oxide comprise deposits of substoichiometric zinc oxide (sometimes referred to as zinc suboxide).

In other embodiments, the plurality of visible material deposits includes one or more decals or stickers placed in contact with the removable transparent film 30. In some cases, the decals comprise porous or perforated decals. Porous decals are particularly desirable because during washing, the washing material can easily seep through the decals to contact the film below. This makes it easier for the decal to become loose and swept away from a film during washing. In some embodiments, the noted decal is porous to water. For example, the decal can define a plurality of spaced-apart openings (e.g., each having a diameter or width of less than about $1/8$ inch, and perhaps more preferably less than about $1/16$ inch) extending entirely between a front face of the decal and a back face of the decal, the back face commonly adhered to the removable transparent film 30. In certain cases, the decal includes machine readable information, e.g. a bar code, containing any pertinent information to the manufacturer, the washer, the homeowner, etc. For example, the information may include information about when the substrate was coated. Any conventional or known technology can be used to produce and/or use the machine readable information. In cases where it is desired to temper glass bearing a decal of the described nature, the decal can optionally be made of organic material if it is desired to remove the decal during tempering.

Preferably, the decal is applied in contact with the removable transparent film 30 through an adhesive. Any conventional and known adhesive material can be used to apply the decal in contact with the film 30. In some embodiments, the decal is applied to a surface of the film 30 by applying the adhesive material to a surface of the decal and placing that surface in contact with a surface of the film 30. In other embodiments, the decal material is provided already having a film of adhesive material on a surface thereof. The adhesive material is typically protected by a liner, e.g. wax paper, that can be removed when it is desired to apply the decal in contact with the film 30. In these embodiments, the decal is applied in contact with the film 30 by removing the liner from the decal, thereby exposing an underlying adhesive film, and placing the decal surface containing the adhesive film in contact with the film 30.

In certain embodiments, the plurality of visible material deposits includes deposits of removable ink. In some cases, the removable ink is water-soluble ink. Embodiments of this nature offer certain unique benefits, which are described below. More preferably, the removable ink is an ink that is stable in the presence of water but breaks down in the presence of a weak acid or a weak base. The removable ink can be deposited on the removable transparent film 30 according to any suitable method. Preferably, the removable ink will be deposited by a standard printer. More preferably, the removable ink will be deposited by an inkjet printer, and good results may be obtained through use of a Videojet Excel Series 273se Inkjet Printer, which is manufactured and distributed by Videojet Technologies, Inc., in Wood Dale, Ill., U.S.A.

In certain embodiments, one or more printers are mounted adjacent a path of substrate travel on a substrate coating line (e.g., a sputtering line). The printers would typically be mounted toward the end of the sputtering line, so they would operate after the removable transparent film has been applied. In some cases, each printer is coupled to one or more printer heads, which are adapted for printing on substrates being conveyed along the line (preferably while the substrates are still moving). Each printer head is located at a desired location along the sputtering line. In one embodiment, two printers are used and each printer is coupled to two printer heads located at particular locations along the line.

While the printer heads can be located at any desired location along the sputtering line, the heads are preferably positioned directly beneath the path of substrate travel. This is particularly desirable when a removable transparent film is first applied to the substrate by upward sputtering (as described in U.S. patent application Ser. Nos. 10/009,291 and 10/009,284). In this embodiment, when a substrate moves along the sputtering line, the removable transparent film is first applied to the bottom of the substrate by upward sputtering and the ink is next applied by printing upwardly onto the bottom substrate surface (i.e., over the removable transparent film).

In certain embodiments, the invention provides a panel comprising a substrate having a surface carrying a removable transparent film that is stable in the presence of water but that can be removed from the surface by washing with a mild acid or a mild base. The panel also includes a removable presence indicator associated with the removable transparent film wherein the presence indicator comprises a water-soluble ink applied over the removable transparent film. In certain embodiments, there is an optional hydrophilic layer (e.g., silicon dioxide layer) beneath the removable transparent film. This optional hydrophilic layer preferably is durable to the mild acid or mild base that is used to wash away the removable transparent film.

In the present embodiments, the water-soluble ink can advantageously be removed using a conventional industrial glass washer, such as is used when monolithic substrates are assembled into multiple-pane IG units. Alternatively, the water-soluble ink can be removed by tempering the substrate. Conventional glass tempering has been found to remove water-soluble ink. In either case, the water-soluble ink is removed before the substrate is mounted in its final position. This can be advantageous as the longer the ink is left on the substrate, the more chance there is that the ink will have a permanent effect on the substrate. For example, UV radiation and extreme moisture may cause the ink to leave a slight mark on the substrate. Further, when the substrate bears a hydrophilic coating beneath the removable transparent film, the ink may cause the hydrophilic coating to become increasingly hydrophobic. Thus, the present embodiments are expected to avoid such potential problems by assuring the ink is not left on the substrate very long.

Figure 9:
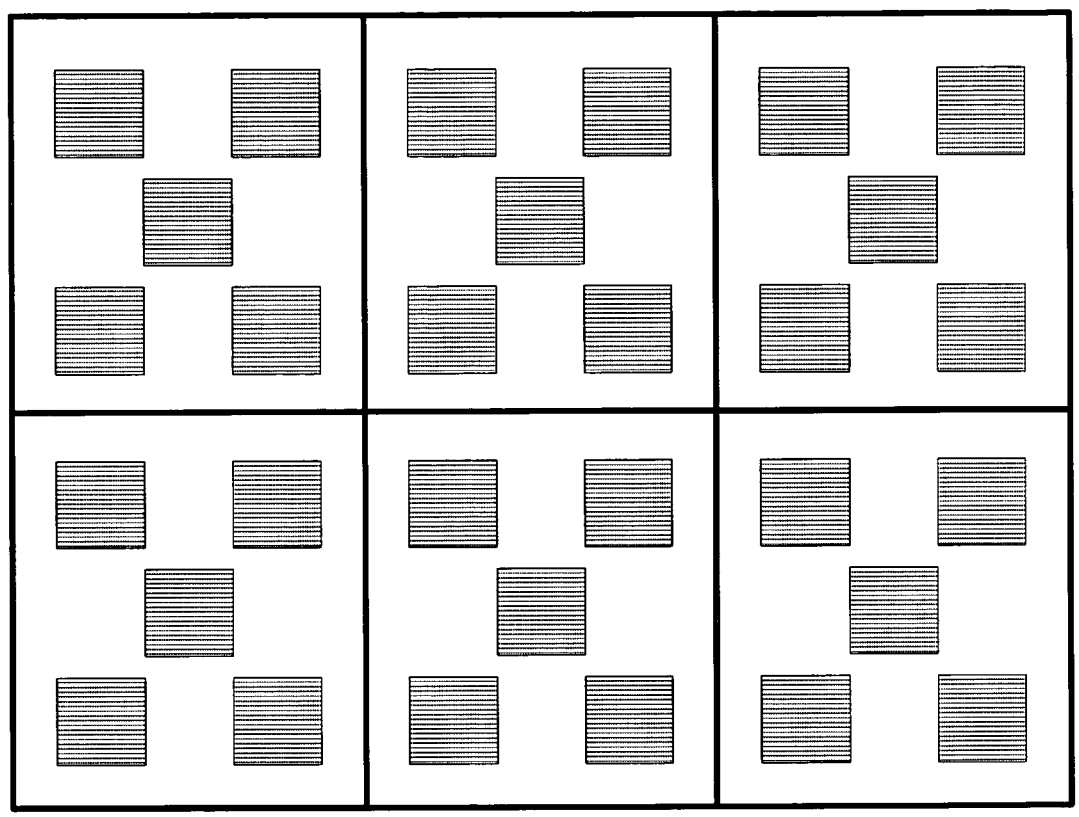
FIG. 9 is a top view of a panel having a substrate having a surface carrying a presence indicator in the form of a plurality of visible material deposits.

In the case of the plurality of visible material deposits, the material deposits can also be provided at spaced-apart locations in association with the removable transparent film 30 such that removal of the film 30 removes the deposits as well. Also, the visible material deposits can be provided in an arrangement characterized by a predetermined spacing between adjacent visible material deposits. Further, the substrate 10 can be adapted for being divided (e.g., cut) into a plurality of smaller substrates of known size, and the predetermined spacing can be selected such that each of the smaller substrates includes at least one of the visible material deposits after such dividing (e.g., cutting). FIG. 9 depicts a top view of a substrate carrying a plurality of visible material deposits spaced from each other so that when the substrate 10 is cut into a plurality of smaller substrates, each of the smaller substrate includes at least one visible material deposit, and desirably several visible material deposits.

While the presence indicator 90 has thus far been described mainly in terms of a material deposited on or incorporated in the removable transparent film 30, it should be understood that the presence indicator 90 could be a natural characteristic of the film 30. For example, in certain embodiments, the coating 20 comprises a reflective coating and the removable transparent film comprises a non-reflective coating. The non-reflective characteristics of the film 30 can serve as the presence indicator 90, the non-reflectivity signaling the presence if the removable transparent film 30.

The presence indicator 90 also desirably is removable by a washing process. In preferred embodiments, the presence indicator 90 is removable by the same washing process as is used to remove the transparent film 30. Like the transparent film 30, the presence indicator 90 is preferably stable in the presence of water having a neutral pH, but breaks down, dissolves, softens, or otherwise deteriorates in the presence of a washing fluid that is mildly acidic or mildly basic, or is simply removed (e.g., carried away) with the removed film 30. When both the removable transparent film 30 and presence indicator 90 are removable by the same washing process, the washing process is greatly facilitated. Preferably, both films are removed by washing with a mildly acidic or mildly basic solution. The washing step can be performed whenever it is desired to expose the underlying substrate surface 32 or coating 20.

In a particularly preferred embodiment, the present invention comprises a glass pane bearing a sputter-deposited hydrophilic coating 20. Any hydrophilic coating 20 can be used. For example, a hydrophilic silicon dioxide coating 20 can be used. The silicon dioxide coating 20 can be advantageously sputtered onto the glass substrate 10 from a silicon-containing target in an oxygen-containing atmosphere. The silicon dioxide is typically applied at a thickness of between about 15 Å and about 350 Å, more preferably between about 15 Å and about 150 Å, and perhaps optimally between about 20 Å and about 120 Å. Upon the silicon dioxide coating 20 can be a sputter-deposited film of zinc suboxide. The film of zinc suboxide can be sputtered onto the silicon dioxide coating 20 from a zinc-containing target in an atmosphere containing insufficient oxygen to completely oxidize the metal. Finally, over the film of zinc suboxide can be a sputter deposited layer of substantially stoichiometric zinc oxide. The zinc oxide is sputtered onto the zinc suboxide film from a zinc target in a fully oxidizing atmosphere. The zinc oxide film is typically transparent and is preferably applied at a thickness of between about 20 Å and about 100 Å (e.g., about 30 Å). In this embodiment, the zinc suboxide film serves as the presence indicator 90 since it has a brownish or hazy appearance. The zinc oxide film is transparent and serves as the removable transparent film 30.

In the present embodiments, when it is desired to expose the underling hydrophilic silicon dioxide coating, a weak acid or base is applied to the surface of the coating (or first to a rag, towel, etc.) and the surface is washed using a soft rag or other suitable material. The washing is continued until the coating is perfectly transparent, signaling that both the zinc oxide and underlying zinc suboxide layers have been removed.

The present invention also includes a method of producing a substrate having a presence indicator associated with a removable transparent film. In certain embodiments, the method comprises providing a substrate having a surface carrying a removable transparent film that can be removed from the surface by a desired washing process and including at least one removable presence indicator in contact with the removable transparent film. The removable presence indicator is preferably removable by the same desired washing process as the removable transparent film.

The step of providing a surface carrying removable transparent film preferably comprises providing a substrate having a surface and applying to the surface a removable transparent film that can be removed from the surface by a desired washing process. The removable transparent film can be applied to the substrate surface using any suitable method. Suitable methods include sputtering, evaporation, and CVD deposition. Preferably, the transparent film is applied using a conventional magnetron sputtering technique.

The removable presence indicator can be applied anywhere in contact with the removable transparent film. In certain embodiments, the removable presence indicator is provided in contact with an outer surface of the removable transparent film, as depicted in FIGS. 1 and 4. In other embodiments, the removable presence indicator is provided in contact with the inner surface of the removable transparent film, as depicted in FIGS. 2 and 5. In other embodiments, one removable presence indicator is provided in contact with the outer surface of the removable transparent film and a second removable presence indicator is provided in contact with the inner surface of the removable transparent film, as depicted in FIGS. 3, 6, and 7.

In further embodiments, the removable presence indicator is associated with the removable transparent film by incorporating visible components (e.g., material) in the removable transparent film, as depicted in FIG. 8. In some embodiments the visible components comprise one or more colorants. In other embodiments, the visible components comprise substoichiometric or superstoichiometric compounds in the removable transparent film. Preferably, the substoichiometric or superstoichiometric compounds comprise metal oxide. Optimally, the substoichiometric or superstoichiometric compounds comprise zinc oxide.

In certain embodiments, the removable presence indicator is applied to the substrate surface by applying a continuous thin film to the substrate surface. The continuous thin film can be applied by any conventional method, preferably by magnetron sputtering. In other embodiments, the removable presence indicator is applied to the substrate surface by applying ink in contact with the removable transparent film. The ink is preferably applied by using a printing process.

In other embodiments, the removable presence indicator is applied to the substrate surface by depositing a plurality of visible material deposits in contact with the removable transparent film. The visible material deposits can be deposited by any suitable method. In some embodiments, the visible material deposits are deposited by sputtering. In other embodiments, the visible material deposits are deposited using a sol-gel technique. Preferably, the visible material deposits are deposited in contact with the removable transparent film at spaced-apart locations. The deposits can also be provided in the form of patterns, words, logos, symbols or any other suitable form. Also, a mask or similar article can be used to deposit the material in these forms. For example, masks are commonly used to create patterns on a substrate. Typically, a patterned masking layer is first applied to the substrate and then a coating or ink is applied thereover. The masking layer is then removed, exposing a pattern of the coating or ink.

The present invention also includes a method of cleaning a substrate to assure exposure of a surface. In certain embodiments, the method comprises providing a substrate having a surface bearing a removable transparent film in contact with a presence indicator signaling the presence of the removable transparent film and washing the substrate sufficiently to remove the transparent film until the presence indicator is no longer visible, to thereby expose the surface. Typically, the presence indicator comprises a detectable characteristic, and washing continues until the detectable characteristic is no longer detectable. Also, the washing typically comprises washing both the presence indicator and removable transparent film by the same washing process (e.g., in a single washing operation). Preferably, the washing process comprises washing with a mild acid or a mild base solution.

In some cases, the presence indicator comprises a visible continuous thin film in contact with the removable transparent film, and the washing continues until no film is visually detectable on the substrate (and in some cases for time after). The visible continuous thin film may comprise a colored thin film, and the washing continues at least until no color is visually detectable on the substrate. In other embodiments, the visible continuous thin film comprises a substoichiometric or superstoichiometric thin film in contact with the removable transparent film, and the washing continues at least until no substoichiometric or superstoichiometric film properties are visually detectable on the substrate.

In other cases, the presence indicator comprises a plurality of visible material deposits in contact with the removable transparent film, and washing continues at least until no visible material deposits are visually detectable on the substrate. In further cases, the presence indicator comprises ink in contact with the removable transparent film, and washing continues at least until no ink is visually detectable on the substrate. In yet other cases, the presence indicator comprises a detectable characteristic incorporated in the removable transparent film and washing continues at least until the detectable characteristic is no longer detectable.

What is claimed is:

1. A panel comprising a substrate having a surface carrying a removable transparent film that can be removed from said surface by a desired washing process, the panel including a removable presence indicator provided in between said surface and the removable transparent film, the presence indicator being separate from the removable transparent film and removable by the same desired washing process as the removable transparent film.

2. The panel of claim 1 wherein the substrate surface is provided with a hydrophilic coating.

3. The panel of claim 1 wherein the substrate surface is provided with a photocatalytic coating.

4. The panel of claim 1 wherein the substrate surface is provided with a reflective coating.

5. The panel of claim 1 wherein the substrate surface is resistant to the presence of a weak acid or a weak base.

6. The panel of claim 1 wherein the removable transparent film is a sputtered film.

7. The panel of claim 1 wherein the removable transparent film has a thickness of less than 100 Å.

8. The panel of claim 1 wherein both the removable transparent film and the presence indicator are durable at glass tempering temperatures.

9. The panel of claim 1 wherein both the removable transparent film and the presence indicator are stable in the presence of water but break down in the presence of a weak acid or a weak base.

10. The panel of claim 1 wherein the removable film is sufficiently transparent so that it cannot be readily detected by visual inspection with the naked eye.

11. The panel of claim 10 wherein the presence indicator has visible characteristics enabling it to be readily detected by visual inspection with the naked eye.

12. The panel of claim 1 wherein the removable transparent film comprises an oxide of a metal selected from the group consisting of zinc, bismuth, cadmium, iron, and nickel.

13. The panel of claim 12 wherein the removable transparent film comprises zinc oxide.

14. The panel of claim 13 wherein the zinc oxide has a thickness of between about 25 Å and about 60 Å.

15. The panel of claim 1 wherein the presence indicator comprises a continuous thin film.

16. The panel of claim 15 wherein the continuous thin film comprises a colored film.

17. The panel of claim 15 wherein the continuous thin film comprises a film of substoichiometric or supersubstoichiometric metal oxide.

18. The panel of claim 15 wherein the continuous thin film comprises a film of substoichiometric or superstoichiometric zinc oxide.

19. The panel of claim 1 wherein the presence indicator comprises a plurality of visible material deposits.

20. The panel of claim 19 wherein the visible material deposits are provided at spaced-apart locations in contact with the removable transparent film.

21. The panel of claim 20 wherein the visible material deposits are provided at spaced-apart locations so that if the panel is cut into smaller panels, each smaller panel comprises at least one visible material deposit.

22. The panel of claim 19 wherein the plurality of visible material deposits includes one or more colorants.

23. The panel of claim 19 wherein the plurality of visible material deposits comprises deposits of a substoichiometric or superstoichiometric metal oxide.

24. The panel of claim 19 wherein the plurality of visible material deposits comprises deposits of a substoichiometric or superstoichiometric zinc oxide.

25. The panel of claim 19 wherein the plurality of visible material deposits comprises water-soluble ink.

26. The panel of claim 25 wherein the water soluble ink comprises ink that is stable in the presence of water but breaks down in the presence of a weak acid or a weak base.

27. A panel comprising a substrate having a surface carrying a removable transparent film that can be removed from said surface by a desired washing process, the panel including a removable presence indicator so associated with the removable transparent film, the presence indicator being removable by the same desired washing process as the removable transparent film, wherein the presence indicator comprises a substoichiometric or superstoichiometric compound.

28. The panel of claim 27 wherein the removable transparent film comprises zinc oxide.

29. The panel of claim 27 wherein the presence indicator comprises a substoichiometric or superstoichiometric zinc oxide.

30. The panel of claim 27 wherein the removable transparent film has an inner surface and an outer surface, the inner surface being closer to the substrate than the outer surface, wherein the presence indicator is provided in contact with the inner surface.

31. The panel of claim 27 wherein the presence indicator is incorporated in the removable transparent film.

32. The panel of claim 31 wherein the removable transparent film is a film of substoichiometric or superstoichiometric zinc oxide.

33. The panel of claim 27 wherein the presence indicator comprises a continuous thin film of substoichiometric or supersubstoichiometric metal oxide.

34. The panel of claim 27 wherein the presence indicator comprises a plurality of visible material deposits that include substoichiometric or superstoichiometric compound.

35. The panel of claim 34 wherein the plurality of visible material deposits include substoichiometric or superstoichiometric zinc oxide.

36. The panel of claim 27 further comprising a functional coating positioned between the substrate surface and the removable transparent film.

37. The panel of claim 36 wherein the functional coating is a hydrophilic coating, a photocatalytic coating, or a reflective coating.

38. The panel of claim 27 wherein both the removable transparent film and the presence indicator are durable at glass tempering temperatures.

39. The panel of claim 27 wherein both the removable transparent film and the presence indicator are stable in the presence of water but break down in the presence of a weak acid or a weak base.

40. A panel comprising a substrate having a surface carrying a removable transparent film that can be removed from said surface by a desired washing process, the panel including a removable presence indicator that is removable by the same desired washing process as the removable transparent film, wherein the presence indicator comprises a plurality of visible material deposits provided at spaced-apart locations in contact with the removable transparent film, wherein the plurality of visible material deposits comprise substoichiometric or superstoichiometric metal oxide.

41. The panel of claim 40 wherein the visible material deposits are provided at spaced-apart locations so that if the panel is cut into smaller panels, each smaller panel comprises at least one visible material deposit.

42. A panel comprising a substrate having a surface carrying a removable transparent film that can be removed from said surface by a desired washing process, the panel including a removable presence indicator that is removable by the same desired washing process as the removable transparent film, wherein the presence indicator comprises a plurality of visible material deposits provided in contact with the removable transparent film, wherein the removable transparent film comprises zinc oxide and the plurality of visible material deposits comprises deposits of a substoichiometric or superstoichiometric zinc oxide.

43. A panel comprising a substrate having a surface carrying a removable transparent film that can be removed from said surface by a desired removing process, the panel including a removable presence indicator that is removable by the same desired removing process as the removable transparent film, wherein the presence indicator comprises a plurality of visible material deposits provided in contact with the removable transparent film, wherein the plurality of visible material deposits comprises one or more decals.

44. The panel of claim 43 wherein the one or more decals are porous.

45. The panel of claim 43 wherein the one or more decals are made of an organic material.

46. The panel of claim 43 wherein the one or more decals contain machine readable information.

47. A panel comprising a substrate having a surface carrying a removable transparent film that can be removed from said surface by a desired removing process, the removable transparent film having an inner surface and an outer surface, the inner surface being closer to the substrate than the outer surface, wherein the panel includes, a first removable presence indicator provided in contact with the inner surface and a second removable presence indicator provided in contact with the outer surface or incorporated in the removable transparent film, wherein both the first and second presence indicators are removable by the same desired washing process as the removable transparent film.

48. The panel of claim 47 wherein one of or both of the first removable presence indicator and the second removable presence indicator comprises a continuous thin film.

49. The panel of claim 47 wherein one of or both of the first removable presence indicator and the second removable presence indicator comprises a plurality of visible material deposits.

50. The panel of claim 47 wherein the first removable presence indicator comprises a continuous thin film and the second removable presence indicator comprises a plurality of visible material deposits.

51. The panel of claim 47 wherein one of or both of the first removable presence indicator and the second removable presence indicator comprise substoichiometric or superstoichiometric metal oxide.

52. The panel of claim 47 wherein one of or both of the first removable presence indicator and the second removable presence indicator comprise one or more colorants.

53. The panel of claim 47 wherein one of or both of the first removable presence indicator and the second removable presence indicator comprise water-soluble ink.

54. The panel of claim 47 wherein each the removable transparent film, the first removable presence indicator, and the second removable presence indicator are durable at glass tempering temperatures.

55. The panel of claim 47 wherein each the removable transparent film, the first removable presence indicator, and the second removable presence indicator are stable in the presence of water but break down in the presence of a weak acid or a weak base.

* * * * *